[12] United States Patent
Zhao et al.

(10) Patent No.: US 12,266,617 B2
(45) Date of Patent: Apr. 1, 2025

(54) CHIP PACKAGE, ELECTRONIC DEVICE, AND CHIP PACKAGE PREPARATION METHOD

(71) Applicant: HUAWEI TECHNOLOGIES CO., LTD., Shenzhen (CN)

(72) Inventors: Nan Zhao, Shenzhen (CN); Chunghsuan Tsai, Shenzhen (CN); Shanghsuan Chiang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 476 days.

(21) Appl. No.: 17/746,186

(22) Filed: May 17, 2022

(65) Prior Publication Data

US 2022/0278056 A1 Sep. 1, 2022

Related U.S. Application Data

(63) Continuation of application No. PCT/CN2019/120325, filed on Nov. 22, 2019.

(51) Int. Cl.
*H01L 23/00* (2006.01)
*H01L 21/56* (2006.01)
*H01L 23/31* (2006.01)
*H01L 23/538* (2006.01)
*H01L 25/065* (2023.01)

(52) U.S. Cl.
CPC .......... *H01L 23/562* (2013.01); *H01L 21/56* (2013.01); *H01L 23/3128* (2013.01); *H01L 23/5383* (2013.01); *H01L 24/32* (2013.01); *H01L 25/0655* (2013.01); *H01L 2224/32225* (2013.01)

(58) Field of Classification Search
CPC . H01L 23/49544–49548; H01L 23/433–4334; H01L 25/03–0756; H01L 23/16; H01L 23/18; H01L 23/24; H01L 2924/35–35121
See application file for complete search history.

(56) References Cited

U.S. PATENT DOCUMENTS

| 8,227,904 | B2 | 7/2012 | Braunisch et al. |
| 9,490,187 | B2 | 11/2016 | Joh |
| 2019/0206807 | A1* | 7/2019 | Cho ............... H01L 29/0657 |
| 2022/0359422 | A1* | 11/2022 | Lin ................... H01L 23/10 |

FOREIGN PATENT DOCUMENTS

| CN | 105006456 A | 10/2015 |
| CN | 106252299 A | 12/2016 |
| CN | 107993994 A | 5/2018 |
| CN | 208655611 U | 3/2019 |
| CN | 109979889 A | 7/2019 |

* cited by examiner

*Primary Examiner* — Amar Movva
*Assistant Examiner* — Eric Manuel Mulero Flores
(74) *Attorney, Agent, or Firm* — Maier & Maier, PLLC

(57) ABSTRACT

A chip package includes a substrate, a first die, a second die, and a beam structure. The first die and the second die are disposed on a side of the substrate and are electrically connected to the substrate. The beam structure is disposed between the first die and the second die. A first end of the beam structure is stacked with and fixedly connected to a part of the first die, a second end is stacked with and fixedly connected to a part of the second die, and the beam structure is insulated from and connected to the first die and the second die. A thermal expansion coefficient of the beam structure is less than a thermal expansion coefficient of the substrate.

20 Claims, 10 Drawing Sheets

```
                                                    ┌─ S101
Dispose a first die and a second die side by side on a surface of a substrate, so that the
  first die and the second die are electrically connected to the substrate separately ┌─ S102
Fasten a beam structure between the first die and the second die ┌─ S103
Fill a filler between the first die, the second die, the beam structure, and the substrate
```

CHIP PACKAGE, ELECTRONIC DEVICE, AND CHIP PACKAGE PREPARATION METHOD

CROSS-REFERENCE TO RELATED DISCLOSURES

This disclosure is a continuation of International Disclosure No. PCT/CN2019/120325, filed on Nov. 22, 2019, the disclosure of which is hereby incorporated by reference in its entirety.

TECHNICAL FIELD

The embodiments relate to the field of semiconductor technologies, and in particular, to a chip package, an electronic device, and a chip package preparation method.

BACKGROUND

With development of a semiconductor technology, electronic devices are developing toward a trend of being light, thin, short, and small. More performance and features are integrated into smaller space. Therefore, a chip package technology becomes more important in an industry chain of the electronic devices. For example, a chip package may perform electrical protection and physical protection on a die.

An increasing demand for iteration of a higher-end chip leads to a continuous increase in an integration degree of a chip package. Dies may be packaged in one chip package. This increases a size of the chip package. An increased size of the chip package brings a new problem, in particular, when dies are packaged together based on a fan-out wafer-level packaging (FOWLP) and a redistribution layer (RDL). FIG. 1 is a schematic diagram of a partial cross-sectional structure of a chip package in a conventional technology. The chip package includes a substrate 01, RDL 02, and dies 03 that are stacked, and a filler 04 filled between the dies 03. For example, the chip package includes two dies 03 in the figure. There is a gap L between adjacent dies 03 in the chip package. When being heated, the substrate 01 is prone to expand. This causes the gap L between adjacent dies 03 to increase. Consequently, a crack is generated between the filler 04 and a side, facing the gap, of the die 03. The crack extends to the redistribution layer 02, affecting reliability of the redistribution layer 02. In addition, when the substrate 01 expands, the gap L between adjacent dies 03 increases. This causes a tensile force on the redistribution layer 02, resulting in a line breakage of the redistribution layer 02 and an increased risk of damage or failure of the chip package.

SUMMARY

Embodiments provide a chip package, an electronic device, and a chip package preparation method, to reduce cases in which a line is broken or damaged, improve reliability and service life of a chip package, enhance board-level reliability, and increase a chip package size.

According to a first aspect, a chip package includes a substrate, a first die, a second die, and a beam structure. The first die and the second die are disposed side by side on a side of the substrate. There is a gap between the first die and the second die. The first die and the second die are electrically connected to the substrate separately. The beam structure is fixedly disposed between the first die and the second die. The beam structure includes a first end and a second end that are opposite to each other. The first end of the beam structure is stacked with a part of the first die. The second end of the beam structure is stacked with a part of the second die. The beam structure is separately insulated from the first die and the second die. In this way, the beam structure is fixedly connected to the first die and the second die. A thermal expansion coefficient of the beam structure is less than a thermal expansion coefficient of the substrate. In this case, when the substrate of the chip package mechanically deforms due to thermal expansion or the like, mechanical deformation of the beam structure is less than mechanical deformation of the substrate. When the first die and the second die become far away from each other along with the deformation of the substrate, the beam structure may provide a tensile force between the first die and the second die. Therefore, cases in which a gap between adjacent dies increases are reduced, and cases in which a line corresponding to the gap is broken or damaged are reduced. This improves reliability and a service life of the chip package and enhances board-level reliability. A chip package may be packaged with a relatively large quantity of dies. This helps increase a size of the chip package but is not prone to damage the chip package. Usually, a thinner chip package is more greatly affected by thermal expansion. This solution can reduce impact from thermal expansion of the substrate on quality of the chip package, so as to thin the chip package.

When the beam structure is disposed, the first die may have a first groove accommodating the first end, and the second die may have a second groove accommodating the second end. Both ends of the beam structure are respectively overlapped inside the first groove and the second groove, so as to reduce a relief between a surface of the beam structure, a surface of the first die, and a surface of the second die on a side away from the substrate. This facilitates completing a packaging process and helps thin the chip package. In addition, this solution further helps improve stability of the beam structure installed between the first die and the second die.

Corresponding to a first groove structure of the first die and a second groove structure of the second die, the beam structure includes a beam body and a protruding portion. The beam body is disposed in the first groove and the second groove. The protruding portion is located between the first die and the second die, and the protruding portion faces the substrate. In this solution, a shape of the beam structure matches a gap shape between the first die and the second die that have grooves. Therefore, installation reliability of the beam structure is improved. Further, the beam structure with the protruding portion has relatively large thickness, so as to have relatively good rigidity. This can improve reliability of a rigid connection between the first die and the second die.

When the chip package is prepared, the chip package further includes a filler filled between the first die, the second die, the beam structure, and the substrate. Rigidity of the beam structure is greater than rigidity of the filler. In this solution, the rigidity of the beam structure is relatively strong, so that the first die and the second die can be rigidly connected by using the beam structure. When the substrate expands, the beam structure may apply a relatively great tensile force between the first die and the second die. Therefore, cases in which a gap between adjacent dies increases are reduced, and cases in which a line directly below line directly below the gap is broken or damaged are reduced.

When the chip package is prepared, surfaces of the beam structure, the first die, and the second die may be flush in a direction away from the substrate. Therefore, surface flatness of the chip package is relatively good, and this facilitates preparation. In an embodiment, a surface processing process of the chip package on the side away from the substrate may be completed by using a grinding process once. This simplifies a packaging process.

The chip package may further include a redistribution layer. The redistribution layer is disposed on a side, close to the first die and the second die of the substrate. The redistribution layer has a metal distribution pattern. The metal distribution pattern includes a part located between the first die and the second die. The beam structure covers the metal distribution pattern located between the first die and the second die. Therefore, targeted protection can be performed on the metal distribution pattern of the redistribution layer, so that the metal distribution pattern is neither prone to a tensile force, and nor prone to be broken. This improves structural reliability of the chip package.

A fixed connection between the beam structure and each of the first die and the second die may be implemented in an adhesive manner. For example, there is a first adhesive layer between the first die and a surface, facing the substrate, of the beam structure. There is a second adhesive layer between the second die and the surface, facing the substrate, of the beam structure. The first adhesive layer may be prepared on a surface, facing the first die of the beam structure; or may be prepared on a surface, facing the beam structure, of the first die. The second adhesive layer may be prepared on a surface, facing the second die of the beam structure; or may be prepared on a surface, facing the beam structure, of the second die. The beam structure is fixedly connected to the first die and the second die in the adhesive manner. A preparation process is relatively simple. In addition, the first adhesive layer and the second adhesive layer have little impact on a structure of the chip package. This helps implement miniaturization of the chip package.

When the beam structure is disposed, the beam structure may be disposed on surfaces, facing away from the substrate, of the first die and the second die. In this case, active surfaces of the first die and the second die are avoided, and pins of the first die and the second die are avoided. This reduces impact of the beam structure on a size of the chip package.

When the beam structure is prepared, a material of the beam structure is not limited. For example, the material of the beam structure may be any one of silicon, metal, glass, or a polymer material. Silicon, metal, and glass each have relatively good rigidity and a relatively small thermal expansion coefficient. This helps improve a rigid connection effect of the first die and the second die and reduce cases in which a line in a region between the first die and the second die is broken. When the material of the beam structure is a polymer material, reliability of a connection between the beam structure and each of the first die and the second die may be improved.

In another implementation, the beam structure may alternatively be a dummy die. The beam structure needs no special design and manufacturing. This helps simplify and reduce a preparation process and preparation costs of the chip package. In addition, in this solution, a defective die or a leftover material in a functional die may be used to prepare a dummy die. This reduces waste and costs.

According to a second aspect, an electronic device may include the chip package in any one of the foregoing embodiments and a printed circuit board. The chip package is electrically connected to the printed circuit board, to implement functions of the chip package. The chip package of the electronic device is not prone to be affected by temperature, has high reliability, service life, and board-level reliability.

According to a third aspect, a chip package preparation method may prepare the chip package in the first aspect. The method includes the following steps: A first die and a second die are disposed side by side on a side of a substrate, so that the first die and the second die are electrically connected to the substrate separately. A beam structure is fastened between the first die and the second die. A first end of the beam structure is stacked with a part of the first die. A second end of the beam structure is stacked with a part of the second die. The beam structure is separately insulated from the first die and the second die. A thermal expansion coefficient of the beam structure is less than a thermal expansion coefficient of the substrate.

In the chip package prepared by using this preparation method, the beam structure is disposed between the first die and the second die. The beam structure may keep a relative location between the first die and the second die stable and reduce a change in a gap between the first die and the second die. For example, when expansion of the substrate causes a tendency of increasing a gap between the first die and the second die, the beam structure may provide a tensile force between the first die and the second die. Therefore, cases in which a line directly below line directly below the gap is broken or damaged are reduced. This improves reliability and a service life of the chip package and enhances board-level reliability. A chip package may be packaged with a relatively large quantity of dies. This helps increase a size of the chip package but is not prone to damage the chip package.

In the foregoing step, the first die and the second die are disposed side by side on the surface of the substrate. Before the foregoing step, a redistribution layer may be prepared on a side, close to the first die and the second die of the substrate. The redistribution layer has a metal distribution pattern. The beam structure covers the metal distribution pattern located between the first die and the second die. In this solution, the beam structure is disposed in a region corresponding to the metal distribution pattern. Therefore, targeted protection is performed on the metal distribution pattern, to prevent a case in which the metal distribution pattern is broken, damaged, or the like due to a tensile force from deformation of the substrate.

In the foregoing step, the beam structure is fastened between the first die and the second die. After the foregoing step, a filler may be filled between the first die, the second die, the beam structure, and the substrate. Rigidity of the beam structure is greater than rigidity of the filler. In this solution, the rigidity of the beam structure is relatively strong. When the substrate expands, the beam structure may strengthen a tensile force between the first die and the second die. Therefore, cases in which a gap between adjacent dies increases are reduced. Cases in which a line directly below line directly below the gap is broken or damaged are reduced.

To implement bonding and fastening between the beam structure and each of the first die and the second die, the beam structure is fastened between the first die and the second die in the step. Before the step, a first adhesive layer may be prepared on a surface, facing the first die of the beam structure; and a second adhesive layer may be prepared on a surface, facing the second die of the beam structure. Alternatively, a first adhesive layer is prepared in a region in which the first die is in contact with the beam structure, and a second adhesive layer is prepared in a region in which the second die is in contact with the beam structure. The beam structure is fixedly connected to the first die and the second die in an adhesive manner. A preparation process is relatively simple. In addition, the first adhesive layer and the second adhesive layer have little impact on a structure of the chip package. This helps implement miniaturization of the chip package.

The first die and the second die are disposed side by side on the surface of the substrate in the step. Before the step, the method includes: preparing the first die and the second die; preparing a first groove on a side, facing the beam structure, of the first die; and preparing a second groove on a side, facing the beam structure, of the second die. The first groove accommodates the first end of the beam structure. The second groove accommodates the second end of the beam structure. This solution helps reduce a relief between a surface of the beam structure, a surface of the first die, and a surface of the second die on a side away from the substrate. This facilitates completing a packaging process, helps thin the chip package, and further improves reliability of a connection between the beam structure and each of the first die and the second die.

DETAILED DESCRIPTION OF THE EMBODIMENTS

Based on problems raised in the background, the embodiments provide a chip package, an electronic device, and a chip package preparation method, to improve rigidness between adjacent dies, reduce an increase in a gap between adjacent dies, and improve reliability and service life of the chip package.

Terms used in the following embodiments are merely intended to describe particular embodiments but are not intended to limit. The terms "one", "a", "the foregoing", "the", and "this" of singular forms are also intended to include a form such as "one or more", unless otherwise specified in the context clearly.

Reference to "an embodiment", "some embodiments", or the like means that one or more embodiments include a feature, structure, or characteristic described with reference to embodiments. Therefore, statements such as "in an embodiment", "in some embodiments", "in some other embodiments", and "in other embodiments" that appear do not necessarily mean referring to a same embodiment, instead, they mean "one or more but not all of the embodiments", unless otherwise emphasized. The terms "include", "comprise", "have", and their variants all mean "include but are not limited to", unless otherwise emphasized.

A chip package includes a housing for installing a semiconductor integrated circuit chip, which has functions such as placing, fastening, sealing, and protecting a die, and enhancing thermoelectric performance. When chip packaging is performed, a die usually needs to be electrically connected to and fixedly connected to a substrate, so as to perform electrical protection and physical protection on the die. In a chip package in a conventional technology, an integration degree of a die is increasingly high. After being heated, a structure of a chip deforms, resulting in damage to the chip package or relatively low board-level reliability. This problem always attracts much attention in the field, and also limits an integration degree of the chip package. Based on actual measurement and simulation results, it may be found that when one chip package includes at least two dies, a gap between adjacent dies increases with thermal expansion of a substrate. This causes damage to a line in the chip package. To resolve the problems, this disclosure provides a chip package, an electronic device, and a chip package preparation method in the following embodiments. To make the objectives, solutions, and advantages clearer, the following further describes the embodiments in detail with reference to accompanying drawings.

Figure 1:
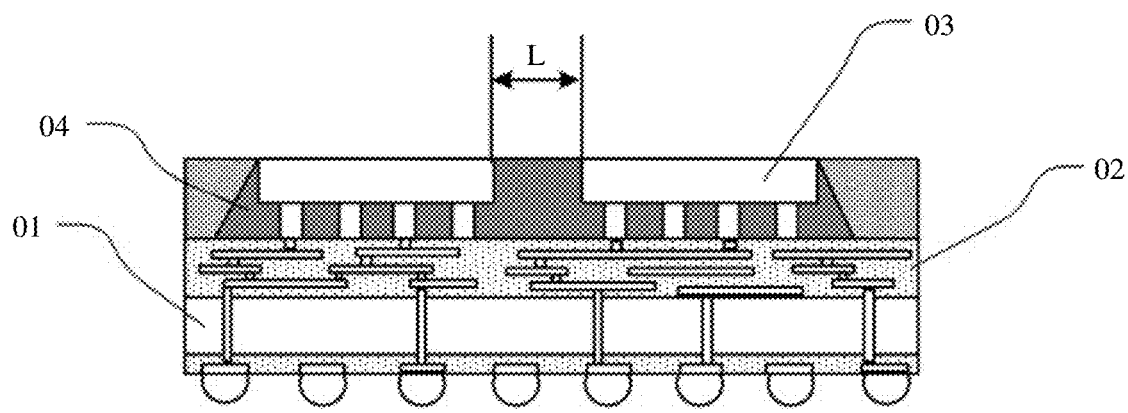
FIG. 1 is a schematic diagram of a cross-sectional structure of a chip package in a conventional technology.
Figure 2:
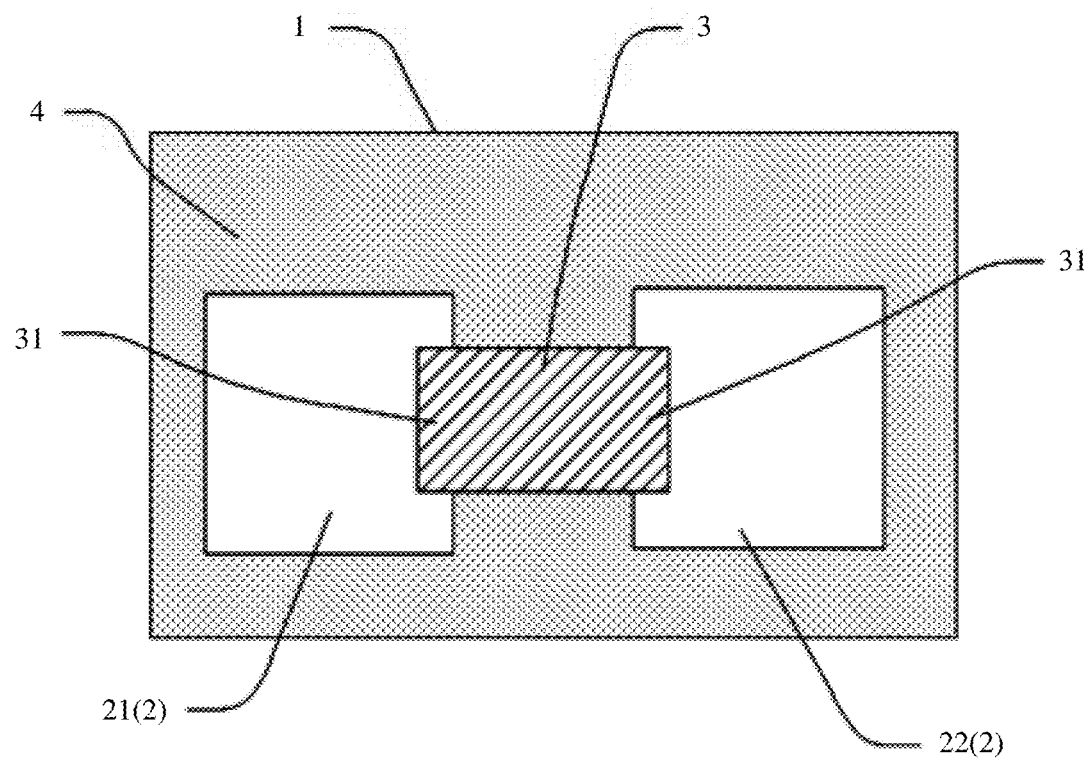
FIG. 2 is a schematic diagram of a top-view structure of a chip package according to an embodiment.
Figure 3:
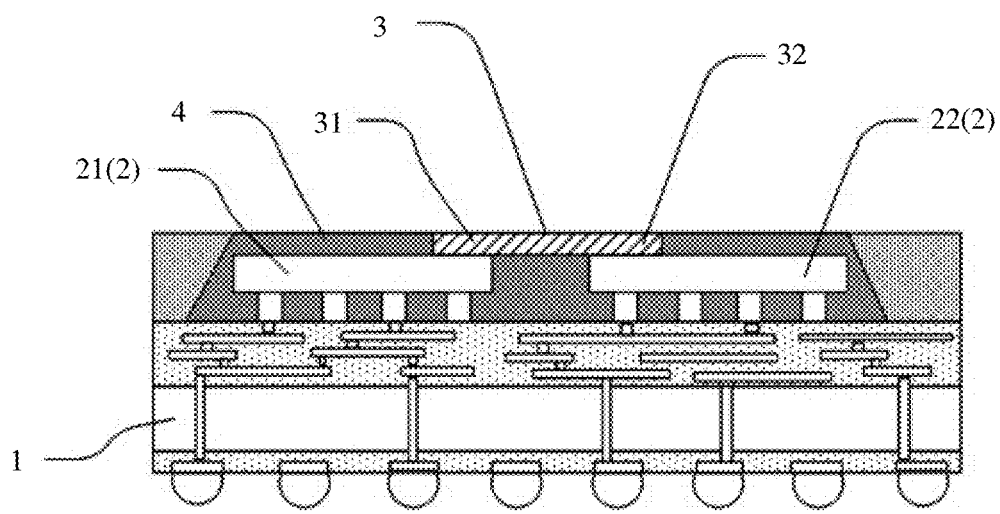
FIG. 3 is a schematic diagram of a cross-sectional structure of a chip package according to an embodiment.

The embodiments provide a chip package. FIG. 2 is a schematic diagram of a top-view structure of a chip package according to an embodiment. FIG. 3 is a schematic diagram of a cross-sectional structure of a chip package according to an embodiment. The chip package includes a substrate 1, a first die 21, a second die 22, and a beam structure 3. For example, the first die 21 and the second die 22 are disposed side by side on a side of the substrate 1. A surface of a side, facing the substrate 1, of the first die 21 is electrically connected to the substrate 1. A surface of a side, facing the substrate 1, of the second die 22 is electrically connected to the substrate 1. For example, the beam structure 3 is disposed between the first die 21 and the second die 22. A first end 31 of the beam structure 3 is fixedly connected to the first die 21, and a second end 32 is fixedly connected to the second die 22. In an embodiment, the first end 31 of the beam structure 3 may be stacked with and fixedly connected to a part of the first die 21, and the second end 32 may be stacked with and fixedly connected to a part of the second die 22. A thermal expansion coefficient of the beam structure 3 is less than a thermal expansion coefficient of the substrate 1. In this case, when the substrate 1 mechanically deforms due to thermal expansion or the like, the beam structure 3 slightly deforms. Therefore, a change in a gap between the first die 21 and the second die 22 can be reduced. For example, when expansion of the substrate 1 causes a tendency of increasing the gap between the first die 21 and the second die 22, the beam structure 3 may provide a tensile force between the first die 21 and the second die 22. Therefore, cases in which a gap between adjacent dies 2 increases are reduced, and cases in which a line directly below the gap is broken or damaged are reduced. This improves reliability and a service life of the chip package and enhances board-level reliability. A chip package may be packaged with a relatively large quantity of dies 2. This helps increase a size of the chip package but is not prone to damage the chip package. Usually, a thinner chip package is more greatly affected by thermal expansion. This solution can reduce impact from thermal expansion of the substrate 1 on quality of the chip package, so as to thin the chip package.

In an embodiment, the first end 31 of the beam structure 3 is opposite to the second end 32. In addition, the foregoing electrical connection refers to a manner in which an electrical connection between two components can be implemented, such as welding or wire bonding. The fixed connection or fixed disposing refers to a manner in which a relatively fixed connection between two components can be implemented, such as bonding, welding, or riveting.

The chip package may further include a filler 4 filled between the first die 21, the second die 22, the beam structure 3, and the substrate 1. Further, rigidity of the beam structure 3 may be greater than rigidity of the filler 4. In this solution, the rigidity of the beam structure 3 is relatively strong, so that the first die 21 and the second die 22 can be rigidly connected by using the beam structure 3. In this solution, when the substrate 1 expands, the beam structure 3 may strengthen a tensile force between the first die 21 and the second die 22. Therefore, cases in which a gap between adjacent dies 2 increases are reduced, and cases in which a line directly below the gap is broken or damaged are reduced. This improves reliability and a service life of the chip package and enhances board-level reliability.

In the foregoing embodiment, the beam structure 3 is separately insulated from the first die 21 and the second die 22. In other words, the beam structure 3 does not need to conduct a signal. However, a material of the beam structure 3 is not limited, and may be an insulating material, or may be a non-insulating material. When the beam structure 3 is a non-insulating material, insulation processing needs to be separately performed between the beam structure 3 and each of the first die 21 and the second die 22. For example, an insulation layer is disposed between the first die 21 and the beam structure 3, and an insulation layer is also disposed between the second die 22 and the beam structure 3. Alternatively, at least one of regions in which the beam structure 3 and each of the first die 21 and the second die 22 are in contact is a non-conductive structure. In an embodiment, the material of the beam structure 3 may be one of silicon, metal, glass, or a polymer material. The beam structure 3 has relatively high rigidity and a relatively low thermal expansion coefficient. Therefore, a rigid connection effect of the first die 21 and the second die 22 can be improved. Impact of thermal expansion of the substrate 1 on a gap between the first die 21 and the second die 2 can be reduced, and cases in which a line in a region between the first die and the second die is broken are reduced. When being a polymer material, the material of the beam structure 3 may be polyimide (PI), epoxy, or phenolic aldehyde. Practice proves that the polymer material and the die 2 can be bonded well.

In addition, the beam structure 3 may further be a dummy die, a die with no electrical connection. In this solution, the beam structure 3 needs no special design and manufacturing. This helps simplify and reduce a preparation process and preparation costs of the chip package. Alternatively, a defective die or a leftover material in a functional die may be used to prepare a dummy die. This reduces waste and costs. In addition, a thermal expansion coefficient of the beam structure 3 is almost the same as that of the first die 21 and the second die 22. Therefore, when the chip package is heated, it is beneficial to improve consistency of thermal deformation degrees of the beam structure 3, the first die 21, and the second die 22. This helps control flatness of the chip package.

The first die 21 and the second die 22 are disposed side by side on a side of the substrate 1. This means that the first die 21 is not stacked with the second die 22, but that the first die 21 and the second die 22 are approximately in a same plane. The plane is approximately parallel to a plane in which the substrate 1 is located.

The first die 21 and the second die 22 are dies 2. The die 2 has a crystalline grain before the chip is packaged. Each die 2 is one unpackaged chip with an independent function and may include one or more circuits. In an embodiment, the die 2 includes but is not limited to an application specific integrated circuit (ASIC), a memory die, an analog die, and the like. The die 2 usually includes a semiconductor substrate and a circuit layer disposed on the semiconductor substrate. A semiconductor component such as a transistor is included on the semiconductor substrate 1. Line layers are disposed on the circuit layer. Various functional circuits are usually disposed on the circuit layer. These functional circuits are coupled to the semiconductor component on the semiconductor substrate 1. Thus, a complete die circuit structure is formed. A surface of a side on which the circuit layer in the die 2 is located is referred to as an active surface. A surface of a side on which the semiconductor substrate in the die 2 is located is referred to as a passive surface. The active surface of the die 2 is electrically connected to the substrate 1, so as to form the chip package.

Figure 4:
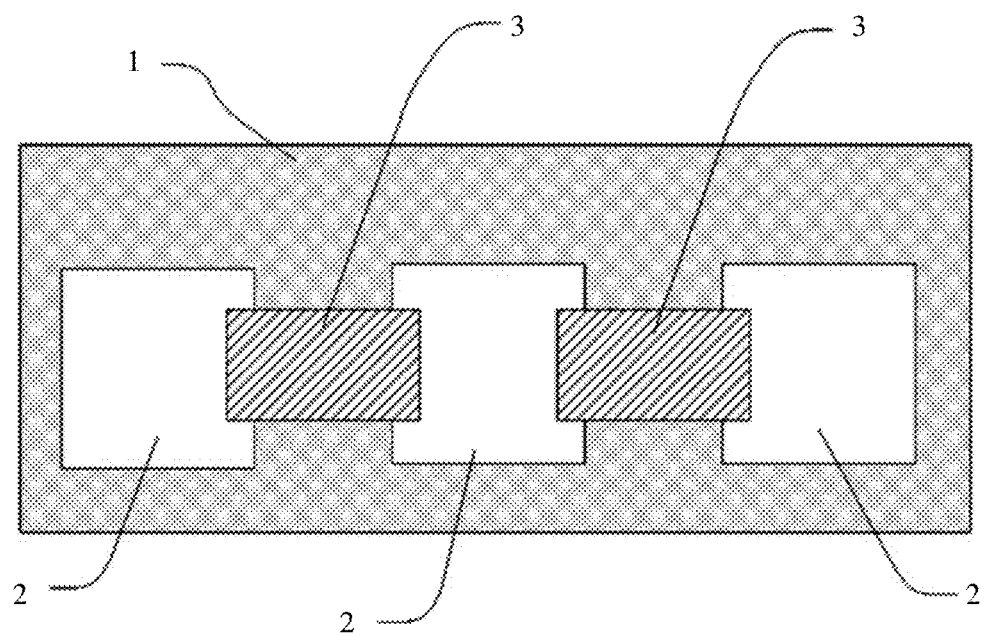
FIG. 4 is another schematic diagram of a cross-sectional structure of a chip package according to an embodiment.
Figure 5:
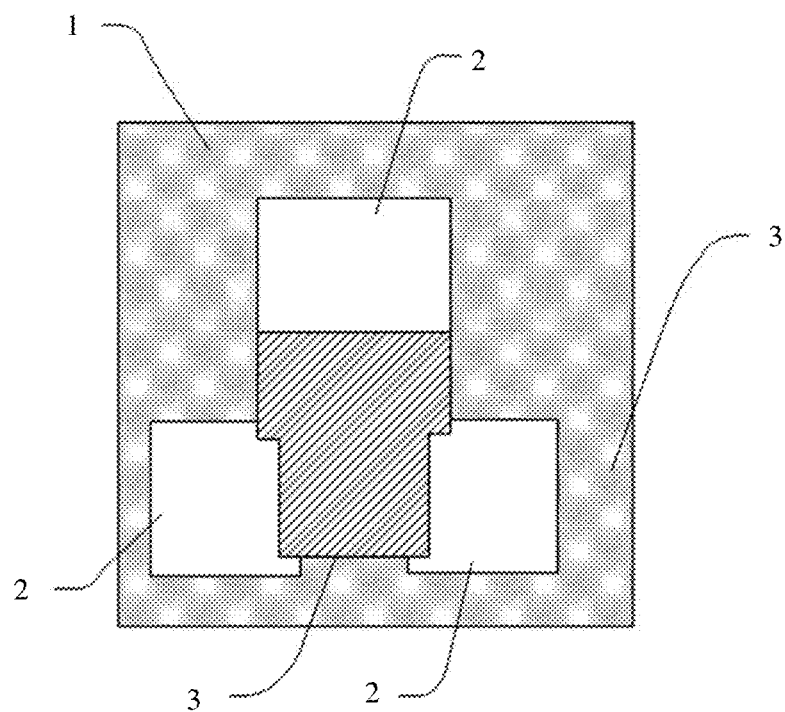
FIG. 5 is another schematic diagram of a cross-sectional structure of a chip package according to an embodiment.
Figure 6:
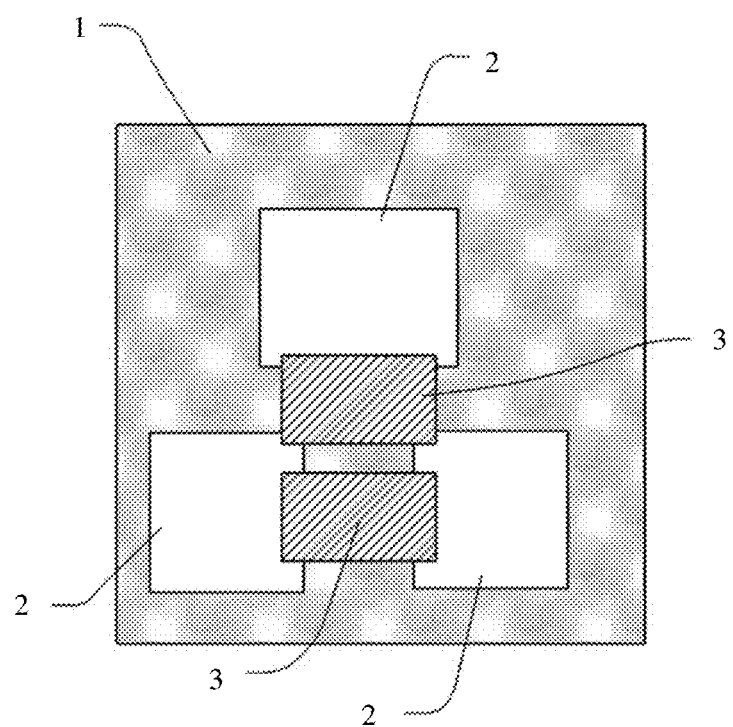
FIG. 6 is another schematic diagram of a cross-sectional structure of a chip package according to an embodiment.
Figure 7:
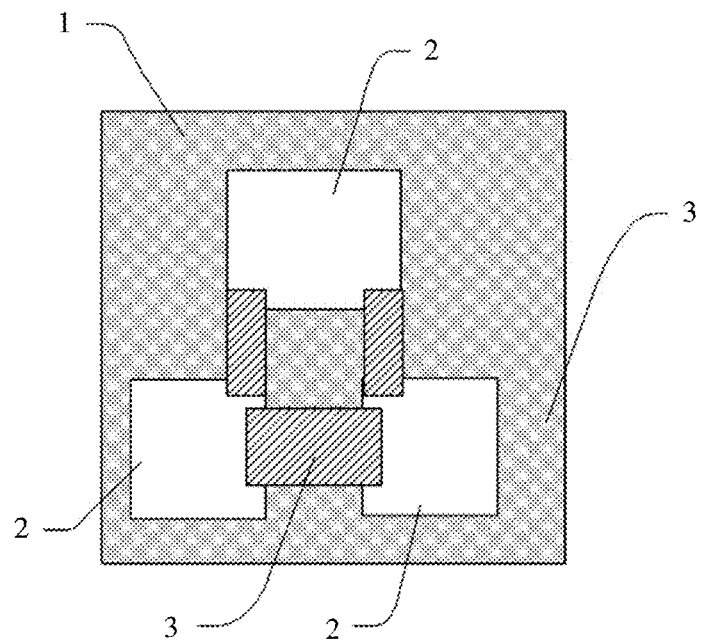
FIG. 7 is another schematic diagram of a cross-sectional structure of a chip package according to an embodiment.

In an embodiment, the chip package may include two or more dies 2. When the chip package includes at least three dies 2, it may be considered that in any two adjacent dies 2, one is the first die 21, and the other is the second die 22. FIG. 4 is a schematic diagram of a top-view structure of a chip package including three dies 2 according to an embodiment. In this embodiment, the three dies 2 are arranged in sequence. The chip package includes two beam structures 3. One beam structure 3 is connected between two adjacent dies 2. FIG. 5 is another schematic diagram of a top-view structure of a chip package including three dies 2 according to an embodiment. In this embodiment, the three dies 2 are staggered, in other words, are not arranged in a straight line. In this case, an integrated beam structure 3 may be disposed, such as a rectangular beam structure 3 or a "T"-shaped beam structure 3 shown in FIG. 5. This simplifies a structure and a preparation method of the chip package. Alternatively, FIG. 6 is another schematic diagram of a top-view structure of a chip package including three dies 2 according to an embodiment. In this embodiment, the three dies 2 are staggered. Two beam structures 3 with a same size may be further disposed. This simplifies a preparation process of the beam structure. As shown in FIG. 7, three beam structures 3 may alternatively be disposed. In an embodiment, the beam structure 3 is disposed between any two adjacent dies 2. In this embodiment, an arrangement manner of the beam structure 3 may be selected based on an actual requirement.

Figure 8:
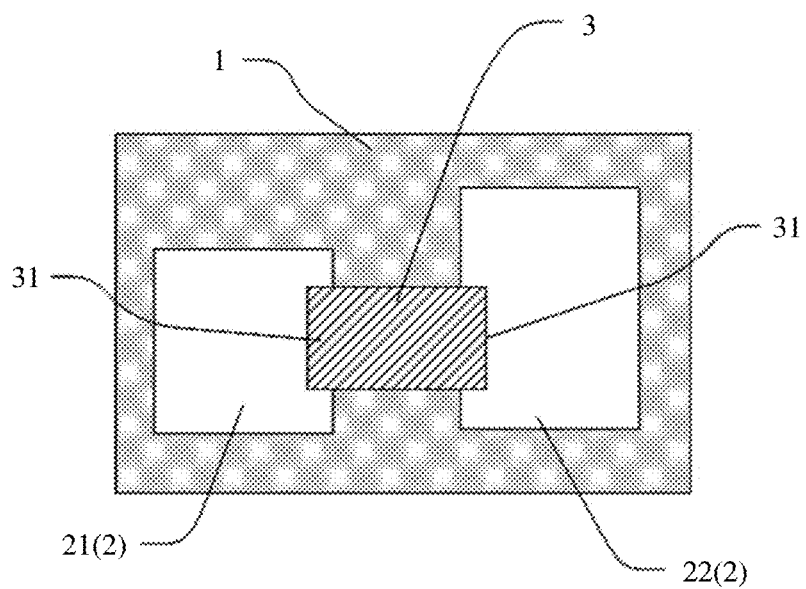
FIG. 8 is another schematic diagram of a cross-sectional structure of a chip package according to an embodiment.

In addition, types, areas, and thicknesses of the first die 21 and the second die 22 in the chip package are not limited and may be the same or different. FIG. 8 is a schematic diagram of a top-view structure of a chip package according to an embodiment. Areas of the first die 21 and the second die 22 in the chip package are different.

When the beam structure 3 is disposed, the beam structure 3 may be disposed on surfaces, facing away from the substrate 1 of the first die 21 and the second die 22. Sides facing the substrate 1 of the first die 21 and the second die 22 are active surfaces; and need to be electrically connected to the substrate 1. In this embodiment, the beam structure 3 is disposed on the surfaces, facing away from the substrate 1 of the first die 21 and the second die 22. In this way, the active surfaces of the first die 21 and the second die 22 can be avoided. This reduces impact on a size of the chip package.

Figure 9:
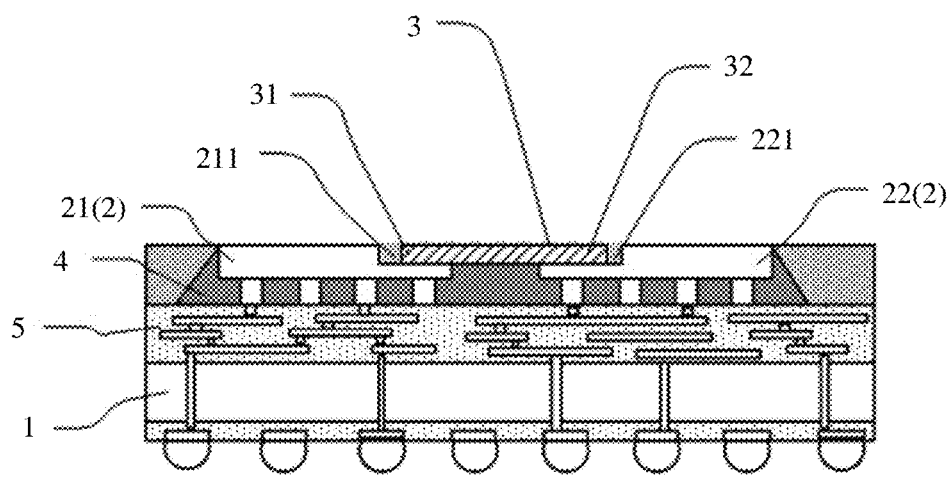
FIG. 9 is another schematic diagram of a cross-sectional structure of a chip package according to an embodiment.

FIG. 9 is another schematic diagram of a cross-sectional structure of a chip package according to an embodiment. When the beam structure 3 is disposed, a first groove 211 may be disposed in a region in which the first die 21 is stacked with the beam structure 3. The first groove 211 accommodates the first end 31 of the beam structure 3. Similarly, a second groove 221 is disposed in a region in which the second die 22 is stacked with the beam structure 3. The second groove 221 accommodates the second end 32 of the beam structure 3. In this solution, both the ends of the beam structure 3 are respectively overlapped inside the first groove 211 and the second groove 221, so as to reduce a relief between a surface of the beam structure 3, a surface of the first die 21, and a surface of the second die 22 on a side away from the substrate 1. This facilitates completing a packaging process and helps thin the chip package. In addition, this solution further helps improve stability of the beam structure 3 installed between the first die 21 and the second die 22.

Figure 10:
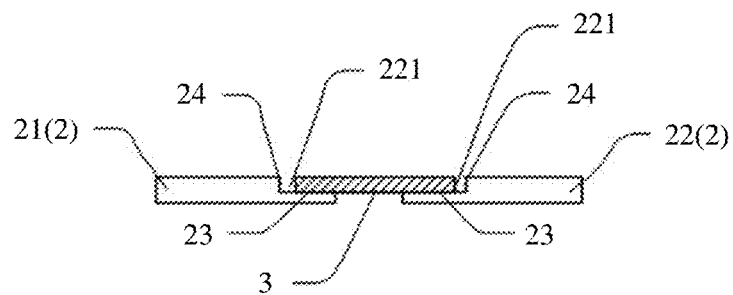
FIG. 10 is a schematic diagram of layout of a first die, a second die, and a beam structure according to an embodiment.

FIG. 10 is a schematic diagram of layout of a first die 21, a second die 22, and a beam structure 3. When the beam structure 3 is disposed, the first groove 211 has a bottom wall 23 approximately parallel to the substrate 1 and a sidewall 24 approximately perpendicular to the bottom wall 23. The second groove 221 also has a bottom wall 23 approximately parallel to the substrate 1 and a sidewall 24 approximately perpendicular to the bottom wall 23. Therefore, a gap exists between the sidewall 24 and a wall surface of the beam structure 3 adjacent to the sidewall 24, so that a relatively large installation tolerance may exist during installation of the beam structure 3. This facilitates completing an installation process of the beam structure 3.

The surface of the beam structure 3, the surface of the first die 21, and the surface of the second die 22 are flush on the side away from the substrate 1. In this solution, surface flatness of the chip package is relatively good. This facilitates installation. In addition, this facilitates using a grinding process once to complete surface processing on the side away from the substrate 1, after the first die 21, the second die 22, and the beam structure 3 are fixedly installed. This further facilitates simplifying a packaging process. In an embodiment, the "flush" refers to approximately flush, and there may be a permissible error in an industry.

Figure 11:
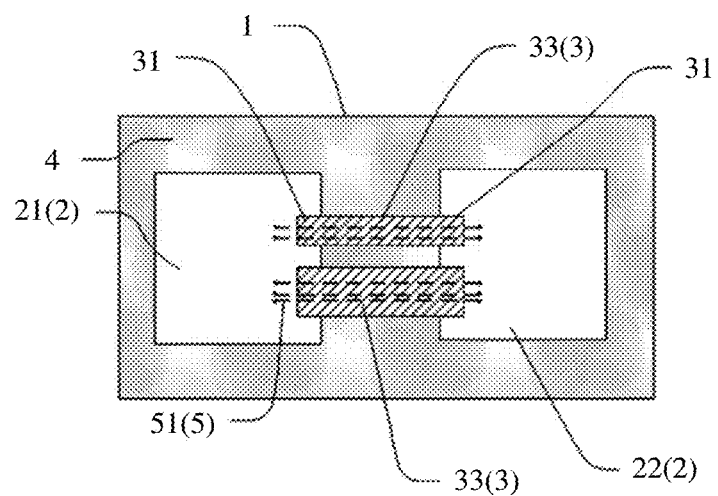
FIG. 11 is another schematic diagram of a top-view structure of a chip package according to an embodiment.

FIG. 11 is a schematic diagram of a top-view structure of a chip package according to an embodiment. The chip package further includes a redistribution layer 5 (RDL). The redistribution layer 5 may be located on a side, close to the first die 21 and the second die 22, of the substrate 1. The redistribution layer 5 includes a metal layer and a dielectric layer deposited on a surface of a wafer, and a corresponding metal distribution pattern 51 is formed. Therefore, a port of the chip package is rearranged, so as to dispose the port to a new region with a looser pitch. Usually, the redistribution layer 5 includes a polymer film material layer and a metal distribution pattern 51. Correspondingly, the metal distribution pattern 51 includes a part between the first die 21 and the second die 22, so that the beam structure 3 can cover the metal distribution pattern 51 between the first die 21 and the second die 22. For example, the beam structure 3 may include at least two sub-beam structures 333. The sub-beam structures 333 are only disposed in a region corresponding to the metal distribution pattern 51 between the first die 21 and the second die 22. Therefore, targeted protection is performed on the metal distribution pattern 51, to prevent a case in which the metal distribution pattern 51 is broken, damaged, or the like due to a tensile force from deformation of the substrate 1. In this solution, one, two, or more sub-beam structures 333 may be included, which may be selected by a user based on a requirement.

When the beam structure 3 is disposed, a shape of the beam structure 3 may not be limited. For example, the beam structure 3 may be rectangular, I-shaped, striped, or grid-shaped, and may be designed and selected based on a requirement.

Figures 12, 13:
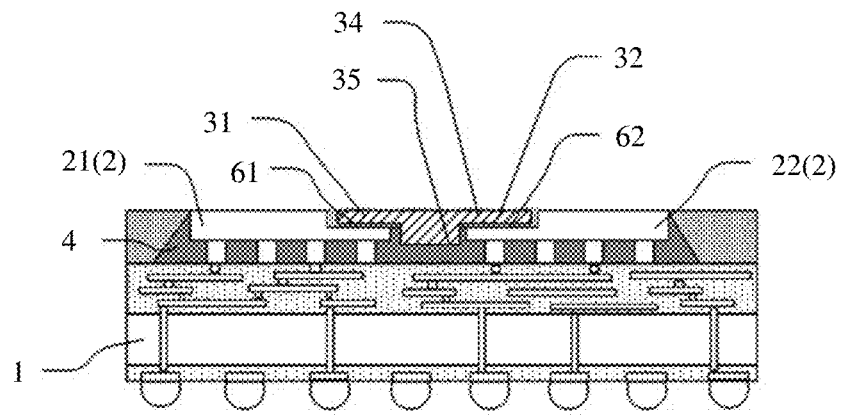
FIG. 12 is another schematic diagram of a cross-sectional structure of a chip package according to an embodiment.
FIG. 13 is a flowchart of a chip package preparation method according to an embodiment.

FIG. 12 is another schematic diagram of a cross-sectional structure of a chip package according to an embodiment. The beam structure 3 may include a beam body 34 and a protruding portion 35. The beam body 34 is disposed in the first groove 211 and the second groove 221. The protruding portion 35 is disposed between the first die 21 and the second die 22 and faces the substrate 1. In this solution, a cross-sectional shape of the beam structure 3 is T-shaped and may match a gap shape between the first die 21 and the second die 22 that have grooves. Therefore, installation reliability of the beam structure 3 is improved. Further, the beam structure 3 with the protruding portion 35 has relatively large thickness, so as to have relatively good rigidity. This can improve reliability of a rigid connection between the first die 21 and the second die 22. The thickness refers to a size of the beam structure 3 that is approximately perpendicular to a direction of the substrate 1.

A manner of connecting the beam structure 3 to each of the first die 21 and the second die 22 is not limited. In an embodiment, the beam structure 3 may be adhesively fastened to the first die 21 and the second die 22. Therefore, there is a first adhesive layer 61 between the first die 21 and a surface, facing the substrate 1, of the beam structure 3; and there is a second adhesive layer 62 between the second die 22 and the surface, facing the substrate 1, of the beam structure 3. The first adhesive layer 61 and the second adhesive layer 62 may completely cover the surface, facing the substrate 1, of the beam structure 3. Alternatively, the first adhesive layer 61 may only cover a surface of the beam structure 3 adjacent to the first die 21, and the second adhesive layer 62 may only cover a surface of the beam structure 3 adjacent to the second die 22. The first adhesive layer 61 and the second adhesive layer 62 may have a same material or may have different materials. The beam structure 3 is fixedly connected to the first die 21 and the second die 22 in an adhesive manner. A preparation process is relatively simple. In addition, the first adhesive layer 61 and the second adhesive layer 62 have little impact on a structure of the chip package. This helps implement miniaturization of the chip package.

An electronic device may include the chip package in any one of the foregoing solutions and a printed circuit board. The chip package is electrically connected to the printed circuit board to implement functions of the chip package. The chip package of the electronic device has high reliability, service life, and high board-level reliability. The electronic device provided in embodiments may include various terminal devices and electronic components, including but not limited to: terminal devices such as a smartphone, a smart television, a smart television set top box, a personal computer (PC), a wearable device, and a smart broadband; telecommunication devices such as a wireless network, a fixed network, and a server; and electronic components such as a chip module and a memory. Examples are not enumerated herein one by one.

Figure 14A:
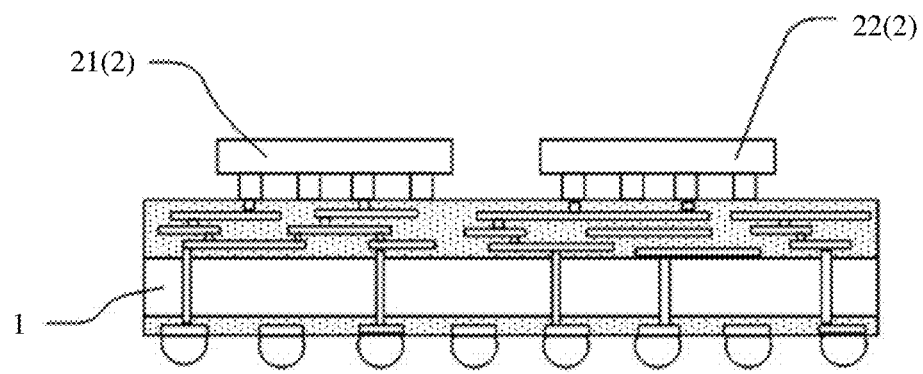
FIG. 14a to FIG. 14c are schematic diagrams of structures of a chip package preparation process according to an embodiment.

A chip package preparation method may prepare the chip package in any one of the foregoing solutions. FIG. 13 is a flowchart of a chip package preparation method according to an embodiment. The chip package preparation method includes the following steps:

Step S101: Dispose a first die 21 and a second die 22 side by side on a surface of a substrate 1, so that the first die 21 and the second die 22 are electrically connected to the substrate 1 separately, to form a structure shown in FIG. 14a.

Figure 14B:
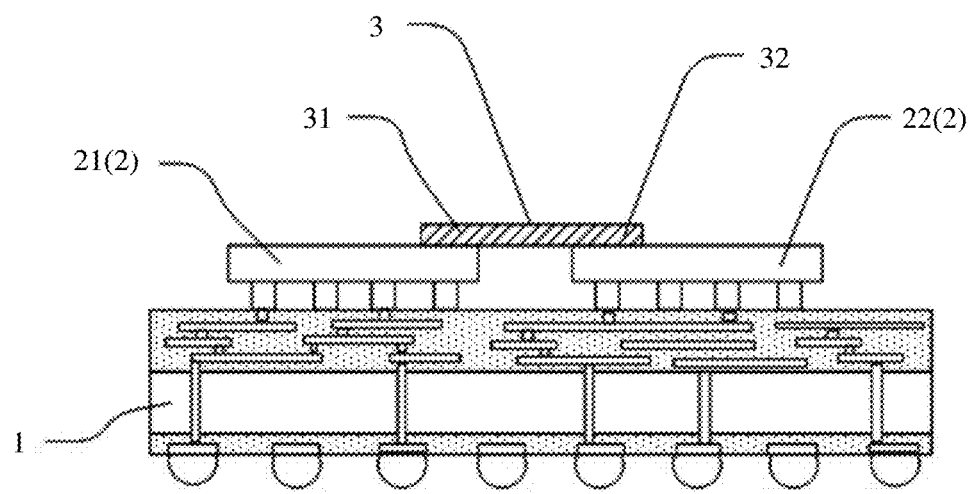

Step S102: Fasten a beam structure 3 between the first die 21 and the second die 22, to form a structure shown in FIG. 14b.

A first end 31 of the beam structure 3 is stacked with a part of the first die 21. A second end 32 of the beam structure 3 is stacked with a part of the second die 22. The beam structure 3 is separately insulated from the first die 21 and the second die 22.

A thermal expansion coefficient of the beam structure 3 is less than a thermal expansion coefficient of the substrate 1.

When the substrate 1 mechanically deforms due to thermal expansion or the like, the beam structure 3 may keep a relative location between the first die 21 and the second die 22 stable. This can reduce a change in a gap between the first die 21 and the second die 22. For example, when expansion of the substrate 1 causes a tendency of increasing the gap between the first die 21 and the second die 22, the beam structure 3 may provide a tensile force between the first die 21 and the second die 22. Therefore, cases in which a gap between adjacent dies 2 increases are reduced, and cases in which a line directly below the gap is broken or damaged are reduced. This improves reliability and a service life of the chip package and enhances board-level reliability. A chip package may be packaged with a relatively large quantity of dies 2. This helps increase a size of the chip package but is not prone to damage the chip package. Usually, a thinner chip package is more greatly affected by thermal expansion. This solution can reduce impact from thermal expansion of the substrate 1 on quality of the chip package, so as to thin the chip package.

A surface of the beam structure 3, a surface of the first die 21, and a surface of the second die 22 are flush on a side away from the substrate 1. In this solution, this facilitates using a grinding process once to complete surface processing on the side away from the substrate 1, after the first die 21, the second die 22, and the beam structure 3 are fixedly installed. This further facilitates simplifying a packaging process.

After step S102 of fastening the beam structure 3 between the first die 21 and the second die 22 is performed, the method may further include step S103: Fill a filler 4 between the first die 21, the second die 22, the beam structure 3, and the substrate 1. Rigidity of the beam structure 3 is greater than rigidity of the filler 4 between the first die 21 and the second die 22, to form a structure shown in FIG. 14c.

For example, a gap between the first die 21, the second die 22, and the substrate 1 may be filled in an underfill manner. Alternatively, the gap between the first die 21, the second die 22, and the substrate 1 may be filled in a molding manner.

Figure 14C:
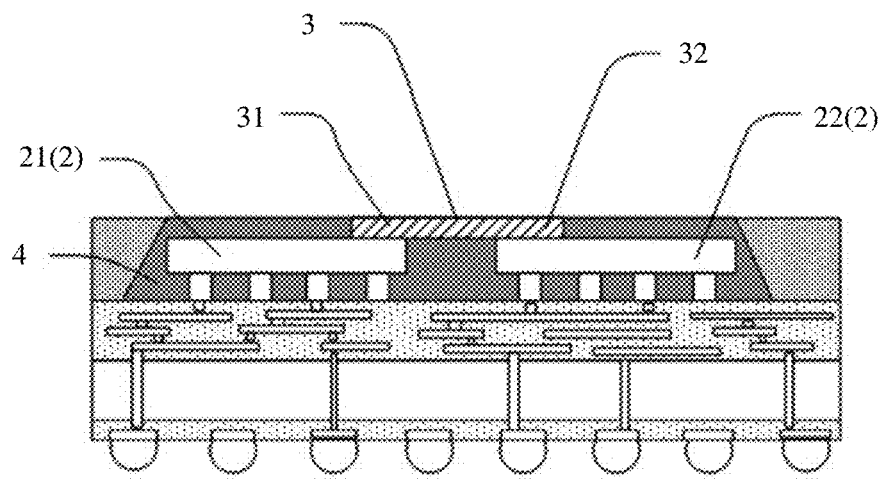
Figure 15A:
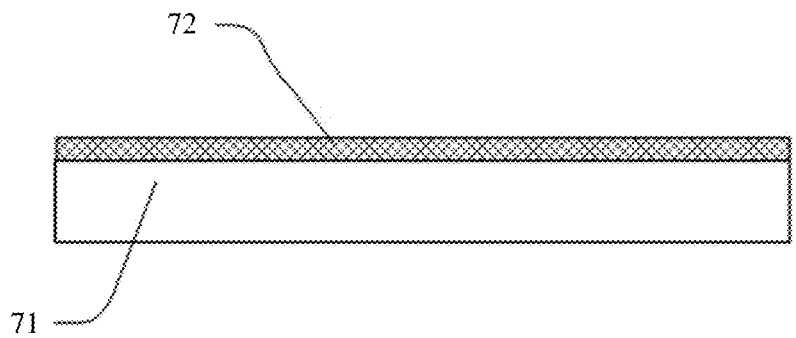
FIG. 15a to FIG. 15f are schematic diagrams of structures of a die preparation process according to an embodiment.
Figure 15B:
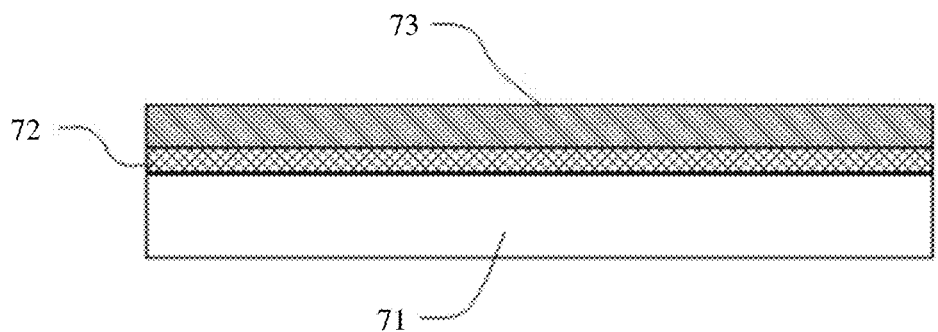
Figure 15C:
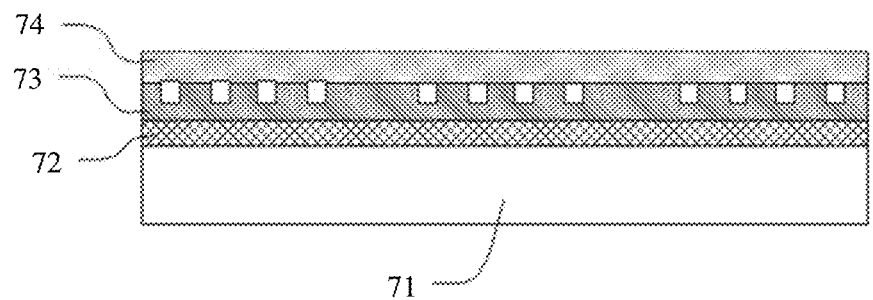
Figure 15D:
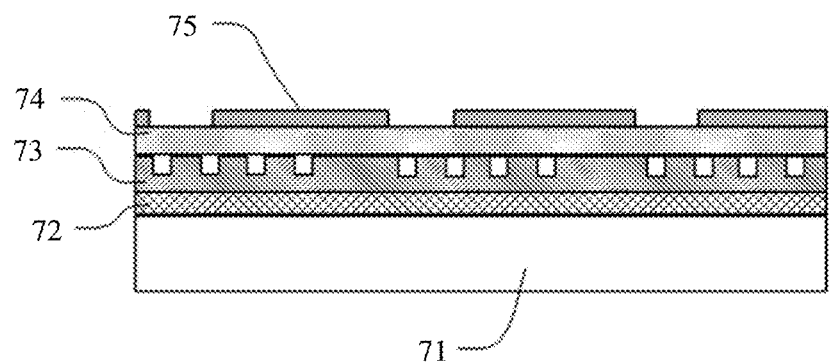
Figure 15E:
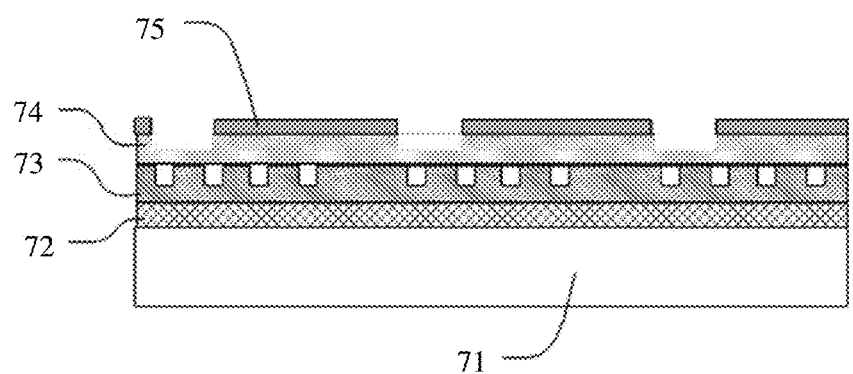
Figure 15F:
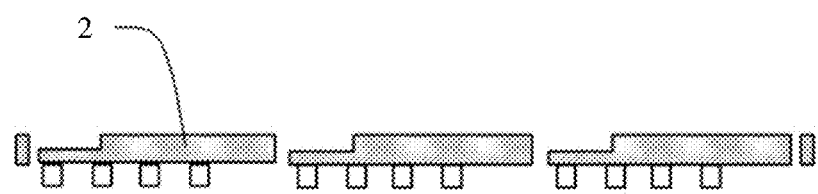

Alternatively, a structure combining the two manners is used in FIG. 14c, to implement a packaging process of the chip package.

In this solution, the rigidity of the beam structure 3 is relatively strong, so that the first die 21 and the second die 22 can be rigidly connected by using the beam structure 3. In this solution, when the substrate 1 expands, the beam structure 3 may strengthen a tensile force between the first die 21 and the second die 22. Therefore, cases in which a gap between adjacent dies 2 increases are reduced, and cases in which a line directly below the gap is broken or damaged are reduced. This improves reliability and a service life of the chip package and enhances board-level reliability.

After step S103 of filling the filler 4 between the first die 21, the second die 22, the beam structure 3, and the substrate 1 is performed, the chip package may be further ground on the side far away from the substrate 1, so that the ground chip package has a relatively flat surface. As shown in FIG. 9, in the chip package prepared by using this solution, the surface of the beam structure 3, the surface of the first die 21, and the surface of the second die 22 are flush on the side away from the substrate 1.

In an embodiment, before step S101 of disposing the first die 21 and the second die 22 side by side on the surface of the substrate 1 is performed, the method includes: preparing a redistribution layer 5 on a side, close to the first die 21 and the second die 22 of the substrate 1. The redistribution layer 5 has a metal distribution pattern 51. The beam structure 3 covers the metal distribution pattern 51 between the first die 21 and the second die 22. For example, the beam structure 3 may include at least two sub-beam structures 333. The sub-beam structures 333 are only disposed in a region corresponding to the metal distribution pattern 51 between the first die 21 and the second die 22, as shown in FIG. 11. In this solution, the sub-beam structures 333 are disposed in the region corresponding to the metal distribution pattern 51, so that a rigid connection is implemented between the first die 21 and the second die 22. Therefore, targeted protection is performed on the metal distribution pattern 51, to prevent a case in which the metal distribution pattern 51 is broken, damaged, or the like due to a tensile force from deformation of the substrate 1.

In addition, to fasten the beam structure 3 between the first die 21 and the second die 22, the beam structure 3 may be separately bonded to the first die 21 and the second die 22. For example, before step S102, a first adhesive layer 61 may be prepared on a surface, facing the first die 21 of the beam structure 3; and a second adhesive layer 62 may be prepared on a surface, facing the second die 22 of the beam structure 3. The first adhesive layer 61 and the second adhesive layer 62 are of an integral structure. In an embodiment, a surface of a side, facing the first die 21 and the second die 22 of the beam structure 3 covers a complete adhesive layer. The first adhesive layer 61 and the second adhesive layer 62 may be implemented in a coating process by coating liquid adhesive on the surface of the beam structure 3. Alternatively, an adhesive process may be used. In an embodiment, double-sided tape is applied to the surface of the beam structure 3.

In another preparation method, before step S102, a first adhesive layer 61 may be prepared in a region in which the first die 21 is in contact with the beam structure 3, and a second adhesive layer 62 may be prepared in a region in which the second die 22 is in contact with the beam structure 3. The first adhesive layer 61 and the second adhesive layer 62 may be implemented in a coating process by coating liquid adhesive on surfaces of the first die 21 and the second die 22. Alternatively, an adhesive process may be used. In an embodiment, double-sided tape is applied to surfaces of the first die 21 and the second die 22.

Before step S101 of disposing the first die 21 and the second die 22 side by side on the surface of the substrate 1 is performed, the method includes: preparing the first die 21 and the second die 22; preparing a first groove 211 on a side, facing the beam structure 3, of the first die 21; and preparing a second groove 221 on a side, facing the beam structure 3, of the second die 22. The first groove 211 accommodates the first end 31 of the beam structure 3. The second groove 221 accommodates the second end 32 of the beam structure 3. In this solution, both the ends of the beam structure 3 are respectively overlapped inside the first groove 211 and the second groove 221, so as to reduce a relief between the surface of the beam structure 3, the surface of the first die 21, and the surface of the second die 22 on a side away from the substrate 1. This facilitates completing a packaging process, helps thin the chip package, and further improves reliability of a connection between the beam structure 3 and each of the first die 21 and the second die 22.

For example, refer to FIG. 15a to FIG. 15f when the first groove 211 is prepared on the side, facing the beam structure 3, of the first die 21, and the second groove 221 is prepared on the side, facing the beam structure 3, of the second die 22. A temporary bonding technology may be first used. In an embodiment, a dissociation layer 72 is first coated to the carrier 71, to form a structure shown in FIG. 15a. For example, the dissociation layer 72 may be a laser dissociation layer, a chemical dissociation layer, a thermal dissociation layer, or the like. Then, bonding adhesive 73 is applied on a surface of the dissociation layer 72 away from the carrier 71, to form a structure shown in FIG. 15b. A wafer 74 is attached to the bonding adhesive 73 on the dissociation layer 72 at a specified temperature and pressure, to form a structure shown in FIG. 15c. A groove is prepared on a surface, facing away from the bonding adhesive 73, of the wafer 74. For example, a light resistance material layer 75 may be coated on the surface. Then, a yellow light process is performed to obtain a light shield. A region in which the wafer 74 needs to be grooved is exposed, and another region is shielded, so as to form a structure shown in FIG. 15d. A groove process is performed by using etching or laser, to form a structure shown in FIG. 15e. Finally, the light resistance material layer 75 is removed, and the wafer 74 is cut to form an independent die 2 with a groove, so as to form a structure shown in FIG. 15f.

A person skilled in the art can make various modifications and variations to embodiments without departing from the scope of the embodiments. is the embodiments are intended to cover these modifications and variations.

What is claimed is:

1. A chip package, comprising:
a substrate;
a first die;
a second die, wherein the first die and the second die are disposed on a side of the substrate, and the first die and the second die are separately electrically connected to the substrate; and
a beam structure, disposed between the first die and the second die, wherein a first end of the beam structure is stacked with a part of the first die, a second end of the beam structure is stacked with a part of the second die, the beam structure is separately insulated from the first die and the second die, and a thermal expansion coefficient of the beam structure is less than a thermal expansion coefficient of the substrate.

2. The chip package of claim 1, wherein the first die includes a first groove accommodating the first end of the beam structure, and the second die includes a second groove accommodating the second end of the beam structure.

3. The chip package of claim 2, wherein the beam structure comprises a beam body and a protruding portion, the beam body is disposed in the first groove and the second groove, the protruding portion is located between the first die and the second die, and the protruding portion faces the substrate.

4. The chip package of claim 1, further comprising:
a filler filled between the first die, the second die, the beam structure, and the substrate, wherein rigidity of the beam structure is greater than rigidity of the filler.

5. The chip package of claim 1, wherein surfaces of the beam structure, the first die, and the second die are flush on a side away from the substrate.

6. The chip package of claim 1, further comprising:
a redistribution layer, disposed on a side, wherein the redistribution layer is close to the first die and the second die of the substrate, the redistribution layer includes a metal distribution pattern, and the beam structure covers the metal distribution pattern located between the first die and the second die.

7. The chip package of claim 1, further comprising:
a first adhesive layer, disposed between the first die and a surface, facing the substrate, of the beam structure; and
a second adhesive layer, disposed between the second die and the surface, facing the substrate, of the beam structure.

8. The chip package of claim 1, wherein the beam structure is disposed on surfaces, facing away from the substrate, of the first die and the second die.

9. The chip package of claim 1, wherein a material of the beam structure is silicon, metal, glass, or a polymer material.

10. The chip package of claim 1, wherein the beam structure is a dummy die.

11. An electronic device, comprising
a chip package;
a printed circuit board, wherein the chip package is electrically connected to the printed circuit board, and wherein the chip package, further comprises:
a substrate;
a first die;
a second die, wherein the first die and the second die are disposed on a side of the substrate, and the first die and the second die are separately electrically connected to the substrate; and
a beam structure, disposed between the first die and the second die, wherein a first end of the beam structure is stacked with a part of the first die, a second end of the beam structure is stacked with a part of the second die, the beam structure is separately insulated from the first die and the second die, and a thermal expansion coefficient of the beam structure is less than a thermal expansion coefficient of the substrate.

12. The electronic device of claim 11, wherein the first die includes a first groove accommodating the first end of the beam structure, and the second die includes a second groove accommodating the second end of the beam structure.

13. The electronic device of claim 12, wherein the beam structure comprises a beam body and a protruding portion, the beam body is disposed in the first groove and the second groove, the protruding portion is located between the first die and the second die, and the protruding portion faces the substrate.

14. The electronic device of claim 11, further comprising a filler filled between the first die, the second die, the beam structure, and the substrate, wherein rigidity of the beam structure is greater than rigidity of the filler.

15. A chip package preparation method, comprising:

disposing a first die and a second die on a side of a substrate, such that the first die and the second die are electrically connected to the substrate separately; and fastening a beam structure between the first die and the second die, wherein a first end of the beam structure is stacked with a part of the first die, a second end of the beam structure is stacked with a part of the second die, the beam structure is separately insulated from the first die and the second die; and a thermal expansion coefficient of the beam structure is less than a thermal expansion coefficient of the substrate.

16. The chip package preparation method of claim 15, further comprising:

preparing a redistribution layer on a side, close to the first die and the second die, of the substrate, wherein the redistribution layer includes a metal distribution pattern, and the beam structure covers the metal distribution pattern located between the first die and the second die.

17. The chip package preparation method of claim 15, further comprising:

filling a filler between the first die, the second die, the beam structure, and the substrate, wherein rigidity of the beam structure is greater than rigidity of the filler.

18. The chip package preparation method of claim 15, further comprising:

preparing a first adhesive layer on a surface, facing the first die, of the beam structure; and preparing a second adhesive layer on a surface, facing the second die of the beam structure.

19. The chip package preparation method of claim 15, further comprising:

preparing a first adhesive layer in a region in which the first die is in contact with the beam structure; and preparing a second adhesive layer in a region in which the second die is in contact with the beam structure.

20. The chip package preparation method of claim 15, further comprising:

providing the first die and the second die;

preparing a first groove on a side, facing the beam structure, of the first die; and preparing a second groove on a side, facing the beam structure, of the second die, wherein the first groove accommodates the first end of the beam structure, and the second groove accommodates the second end of the beam structure.

* * * * *